United States Patent [19]

Boatman et al.

[11] 4,074,188

[45] Feb. 14, 1978

[54] LOW IMPEDANCE FAULT DETECTION SYSTEM AND METHOD

[75] Inventors: Roger M. Boatman; Melvin R. Hall, both of Titusville, Fla.

[73] Assignee: Testline Instruments, Inc., Titusville, Fla.

[21] Appl. No.: 601,172

[22] Filed: Aug. 1, 1975

[51] Int. Cl.$^2$ .................... G01R 31/08; G01R 31/28
[52] U.S. Cl. .................... 324/52; 324/73 PC; 324/133
[58] Field of Search .................... 324/51, 52, 66, 67, 324/72.5, 127, 133, 158 P, 149, 73 PC, 73 R

[56] References Cited

U.S. PATENT DOCUMENTS

| | | | |
|---|---|---|---|
| 2,651,021 | 9/1953 | Hays | 324/52 |
| 2,698,921 | 1/1955 | Wharton | 324/52 |
| 3,303,400 | 2/1967 | Allison | 324/52 UX |
| 3,437,928 | 4/1969 | Baker et al. | 324/133 |
| 3,543,154 | 11/1970 | Gordon | 324/133 X |
| 3,617,879 | 11/1971 | Mugnier | 324/133 X |
| 3,619,775 | 11/1971 | Naylor et al. | 324/133 X |
| 3,621,384 | 11/1971 | Yamada | 324/52 |
| 3,742,351 | 6/1973 | Palmer et al. | 324/133 X |
| 3,753,089 | 8/1973 | Gunn et al. | 324/52 |
| 3,828,256 | 8/1974 | Liu | 324/133 |
| 3,919,631 | 11/1975 | Brown | 324/133 X |
| 3,992,663 | 11/1976 | Seddick | 324/73 PC X |

FOREIGN PATENT DOCUMENTS

| | | | |
|---|---|---|---|
| 281,981 | 9/1965 | Australia | 324/67 |
| 219,493 | 4/1957 | Australia | 324/67 |
| 2,050,705 | 4/1971 | Germany | 324/51 |
| 1,162,811 | 8/1969 | United Kingdom | 324/66 |

OTHER PUBLICATIONS

Czechlewski et al. *Pulse and Level Detector Circuit* Western Electric Technical Digest No. 35 July 1974 pp. 11-13.

*Primary Examiner*—Gerard R. Strecker
*Attorney, Agent, or Firm*—Burns, Doane, Swecker & Mathis

[57] ABSTRACT

Isolation of a wired-OR fault on a printed circuit board is accomplished by first powering up the circuit board, then injecting a short pulse on the common buss and detecting the current flow by use of a ferrite core. The ferrite core is sufficiently small that it can be moved about the circuit board to the terminals of the various components that are connected to the current buss in a wired-OR configuration. The change of inductance created by the magnetic field associated current pulse flowing through the terminal of a component sinking the current creates a ringing effect which is amplified and compared against a reference voltage. The output of the comparator circuit is used to create a fault alarm signal.

23 Claims, 5 Drawing Figures

LOW IMPEDANCE FAULT DETECTION SYSTEM AND METHOD

The present invention relates to the trouble shooting of electronic equipment and more particularly relates to the fault isolation on a printed circuit board where a large number of components are connected in a wired-OR configuration. More specifically, the present invention relates to a novel system and method for supplying a test current pulse to a common buss and sensing the change of magnetic field associated with the current flow pattern through the various components attached in a wired-OR configuration to determine which component is continuously sinking the current and thereby isolating the defective device.

There has long been a need to isolate the sink point of a current injected into a buss. With printed circuit boards having a high density of expensive components, the problem of identifying a faulty component which renders the entire circuit board unusable is important from an economic standpoint. If the situation arises where the output of two or more components such as integrated circuits (IC's) are tied to one buss in a wired-OR configuration and that buss is held low because of a defective IC, the objective is to locate the defective IC so that it can be replaced without removal of other components from the circuit board.

The major object of the present invention is to provide a novel method and system for isolation of the sink point of a current injected into a buss where a plurality of components are connected to the buss in a wired-OR configuration.

Another object is to provide a novel test apparatus which injects a logic pulse into a buss and detects the change of magnetic field associated with the flow of that current along the conductors on the printed circuit board or in the terminal of a defective IC or other electronic component while it is connected on the board.

A further object is to isolate a defective electrical component connected in a wired-OR configuration by sensing the current through the use of a probe that contains a magnetic element responsive to the change of magnetic field associated with a current pulse applied to the buss. In a preferred form, the sensing element employs a magnetic member such as a ferrite inductor which is located to undergo a change in inductance resulting from the first derivative of the magnetic field associated with the current pulse and be part of a resonant circuit. The resultant ringing output signal from resonant circuit is rectified to produce an output voltage which is compared with a reference voltage. Finally the comparison is checked at a predetermined time to unmask the current flowing from the regular pull-up of the buss to its normal operating logic voltage level ($V_{cc}$). The sensing element is made very small so that it can be selectively positioned at individual terminals on the electronic components on the printed circuit board, and along individual conductors on the circuit board to detect solder bridges or similar low impedance defects.

These and other objects of the invention will become more fully apparent from the claims and from the description as it proceeds in connection with the appended drawings wherein:

Figure 1:
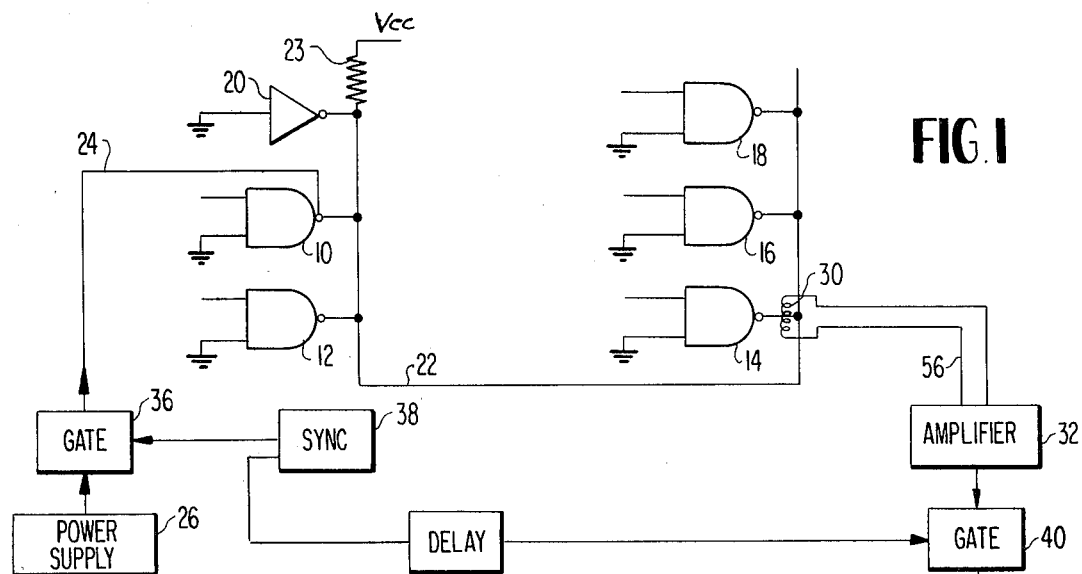
FIG. 1 is a block diagram of a wired-OR fault tester in accordance with the present invention.

Referring to FIG. 1, the circuit there illustrated shows a group of five NAND circuits 10, 12, 14, 16 and 18 and an invertor circuit 20 connected to a current buss 22 in a wired-OR configuration. Current buss 22 is illustrated as being connected to $V_{cc}$ through a resistor 23. One terminal of each of the NAND circuits and the invertor 20 is connected to ground to thereby raise buss 22 to a non-ground logic level $V_{cc}$ in a properly operating circuit. However, if any component attached to buss 22 has a defect which causes sinking of the current in buss 22 to ground, the potential of buss 22 cannot increase to its logic level by application of $V_{cc}$.

In accordance with the present invention, a current pulse is injected through lead 24 from power supply 26 into buss 22 in any convenient manner. In FIG. 1, lead 24 is shown connected to a terminal of NAND circuit 10. A current sensing probe 30 is provided which is of such a size that it can be placed adjacent a terminal of each of the active circuit elements which are connected to buss 22. The terminal of the defective element that is sinking the current from buss 22 to ground will be carrying essentially all of the current in the current pulse from power supply 26 applied through lead 24. This current flow can be detected by probe 30 by merely sequentially placing the probe adjacent to the terminal of each of the components connected to buss 22 without unsoldering or otherwise removing the components from their connection in the electrical circuit. Probe 30, by detecting the magnetic field associated with the sinking current, produces an output signal which is applied to amplifier 32 and, when above a threshold level, produces a fault manifestation on indicator 34.

Probe 30 can be moved manually from terminal to terminal along buss 22, or alternatively can be moved along buss 22 to follow the path of the heavy current flow to give the geographical location of the region where the current flow disappears. Thus, solder bridges between conductor strips on printed circuit boards or other defects in the manufacture of the board resulting in improper connections to current buss 22 can be detected.

When using the apparatus of the present invention, the circuit board can conveniently be removed from the equipment, or alternatively the equipment may be suitably programmed. Each of the circuit components connected in a wired-OR configuration to the current buss 22 should be controlled to allow current buss 22 to rise to its logic level. In the case of NAND circuits, this can be easily done as illustrated in FIG. 1 by simply grounding one input terminal by any suitable means such as by use of alligator clips.

One of the major difficulties in constructing equipment of a type which will reliably locate the faulty component is overcome by providing a power supply 26 that produces a current pulse sufficiently large that it can be detected by current sensor 30 and yet not be so large as to damage other components connected to the current buss 22. It has accordingly been found desirable to provide a gate 36 which limits the duration of the current pulse on lead 24. In practice, the current pulse can be comparatively short, such for example a millisecond or less. In the preferred embodiment, the duration of the current pulse may be as short as 4 $\mu$ seconds. The power supply 26 should be of a character to produce a voltage of the magnitude commonly used in MOS logic with a current of at least 60 ma and preferably 100 ma or more. Gate 36 may be controlled by any suitable means such as a gating signal from a sync generator 38.

To reduce the likelihood of extraneous electrical signals on buss 22 causing false readings, it has been found desirable to examine the output signal from amplifier 32 during a shorter period than the duration of the applied pulse on lead 24. Accordingly, a gate 40 may be located between amplifier 32 and indicator 34 and controlled by a signal from the sync generator 38. The time of occurrence of the opening of gate 40 is desirably delayed somewhat so that transients created by the application of the supply voltage V$cc$ have disappeared before examining the output of amplifier 32. Since the duration of the period for examination may be very short such, for example, as 1 $\mu$ second or less, the delay of the signal from probe 30 through amplifier 32 can become significant and gate 40 therefore may be opened during the latter part of the period when the current pulse is injected in lead 24. If the current pulse is very short such, for example, as 4 to 10 $\mu$ seconds, the opening of gate 40 may be delayed until after the current pulse on lead 24 has been turned off.

Indicator 34 is preferably of the type which once turned on remains on until reset.

In practicing the method of the present invention, the probe 30 is moved along buss 22 and positioned at the terminals of each of the active elements attached to buss 22. Sync generator 38 may be either free-running or operated manually as probe 30 is moved. Once the defective circuit component has been isolated, it can then be removed from the circuit and replaced by a new unit.

Figure 2:
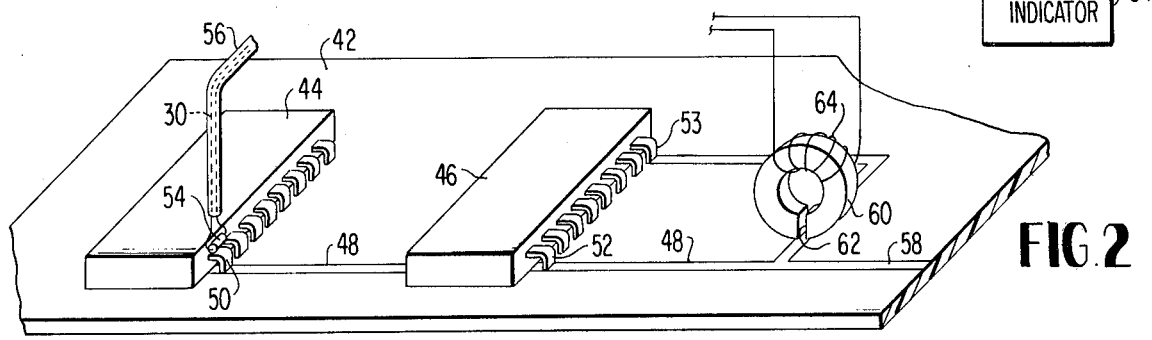
FIG. 2 is a pictoral drawing of a printed circuit board showing IC packages having terminals connected to the same electrical conductor to be connected in a wired-OR configuration together with two current sensing devices of alternative configuration.

Referring to FIG. 2, a printed circuit board 42 is shown with IC housings 44 and 46 having active components connected in a wired-OR configuration to buss 48. The IC housings shown are of the dual in-line type customarily available with eight pins on each side. Terminal 50 of IC housing 44 and terminals 52 and 53 of IC housing 46 are shown connected to buss 48 in a wired-OR configuration.

Adjacent terminal 50, a current sensing probe 30 is illustrated which has a current sensing element 54. The current sensing element 54 is located at terminal 50. Element 54 may be a ferrite core in the shape of a cylindrical body having its longitudinal axis oriented in a position perpendicular to the current flow path through terminal 50. Element 54 may be in contact with a surface of terminal 50 or slightly spaced therefrom. Ferrite inductor elements 54 are available commercially with two leads extending from opposite ends. These leads may be connected to insulated wires in a shielded cable 56 which is shown in FIG. 1 as extending to amplifier 32.

Assuming that the current pulse is injected in buss 48 at some remote location such as at point 58, inductor 54 is shown having its major axis in a direction to be affected by the magnetic field accompanying the flow of current through terminal 56. If the portion of the circuit in IC 44 connected with terminal 50 is sinking the current from buss 48, then the current flow through terminal 50 will be sufficient to create a magnetic field which so influences the inductance of ferrite member 54 as to produce an electrical signal which the amplifier 32 can increase to a level suitable for actuating indicator 34. A particular circuit found useful is shown and will be described in greater detail in connection with FIG. 5.

Current pulses applied, for example, at point 58 in FIG. 2 may be of such magnitude that they may also be detected by other types of devices. For example, the magnetic field associated with the current flow may be detected by any current measuring instrument capable of being used without breaking the circuit. By way of example, the magnetic field produced by the current flow may be measured by a small magnetic core 60 provided with a gap 62, which can be placed adjacent to a conductor as illustrated so that a considerable part of the magnetic flux produced by the current flow passes through the magnetic core. A winding 64 upon the core thus has induced a current which is proportional to the current pulse flowing in the conductor. A pulse amplitude discriminator together with such amplifiers as may be needed can thus be used for actuating indicator 34 in the system as shown in FIG. 1.

As is evident from FIG. 2, the current sensing device may be located along the buss 48 for tracing the heavy current flow. Thus when the circuit branches, the equipment of the present invention can be used in a way to follow the flow of the current through the circuit board.

Figure 3:
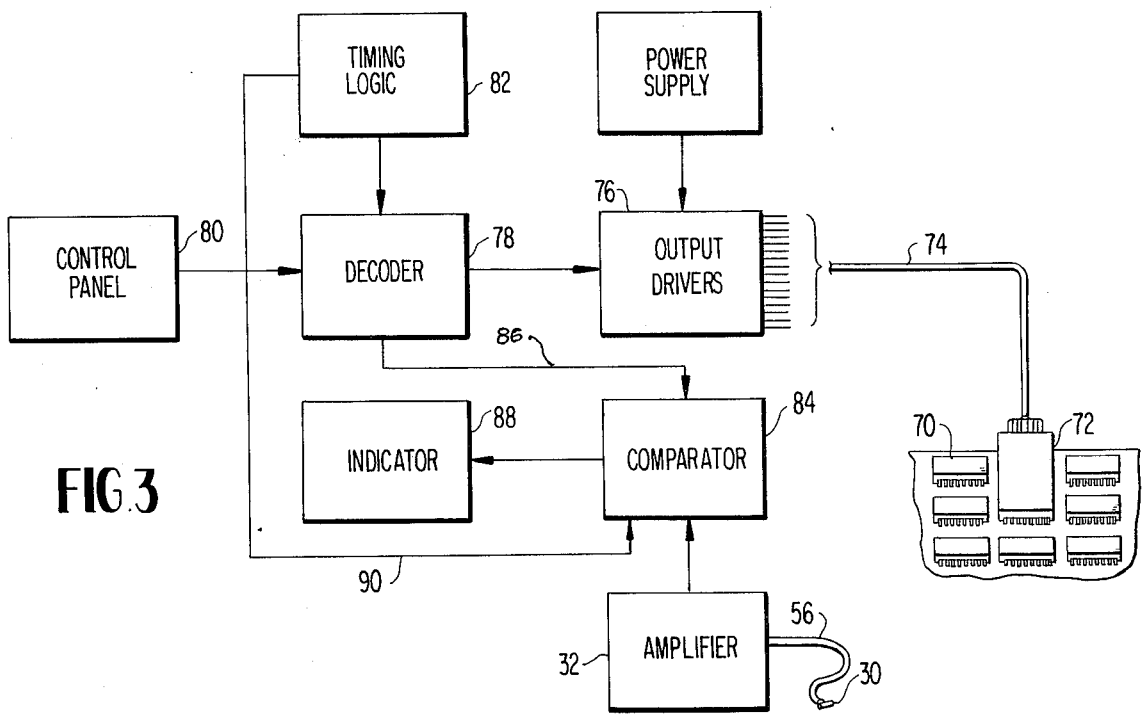
FIG. 3 is a block diagram of a second embodiment employing a clip type connector for applying power to the printed circuit board.

In FIG. 3, a circuit board 70 is shown having three rows of IC's of the dual in-line type with 16 terminals, eight on each side. A connector element that is spring biased to a closed position and openable to reach across the IC and having eight terminals on each side is shown connected to one of the Ic's. Such a device is well known and described in our U.S. Pat. No. 3,870,953 dated Mar. 11, 1975.

The connector 72 and the equipment shown attached to the cable 74 may comprise the test equipment described in our prior patent. Each of the 16 leads is supplied with voltage levels controlled by output driver 76 which preferably are of the type shown in FIG. 3 in our U.S. Pat. No. 3,870,953. These drivers are controlled by a decoder 78 that is in turn controlled by a control panel 80 that is operated manually or by suitable software. Sequencing of the system is controlled by timing logic 82 so that the current pulses of the appropriate polarity are provided through cable 74 and connector 72 through the appropriate terminals of an IC package while it is connected to a printed circuit board. This equipment contemplates that the printed circuit board would be removed from its normal operating environment and the sole source of power to the printed circuit board during testing would be supplied through connector 72. Ground connections to appropriate terminals of all IC's connected in the wired-OR configuration as discussed in connection with FIG. 1 are used, but not shown in FIG. 3.

The present invention thus can be considered as an attachment to the equipment described in our prior patent. As shown in FIG. 3, the probe 30 with its current sensing element is attached to cable 56 and amplifier 32. Probe 30 is sufficiently small so that it can be maneuvered along the conductors on the printed circuit board and located adjacent the various terminals of the IC housings as illustrated in FIG. 2.

The output of the amplifier 32 may be applied to a comparator 84 which may receive reference voltages from decoder 78 on lead 86. In this arrangement, the indicator 88 provides a fault indication only when the voltage of the output signal from amplifier 32 exceeds a reference voltage on lead 86 in the comparator. Where a short current pulse is applied to lead 74 and it is desired to use a short period for operation of comparator 84, a suitable timing signal may be obtained from lead 90 that is connected to timing logic 82. By this arrangement, comparator 84 is enabled only during a short time duration controlled by the signal on lead 90 that is much less than the duration of the current pulse on lead 74. As stated above, the current pulse on lead 74 may have a duration of as little as 10 $\mu$ seconds and the comparator enable signal on lead 90 may have a duration of 1 $\mu$ second or less.

In the use of the equipment in accordance with the present invention, the test cycle is repeated periodically as discussed in our prior U.S. Pat. No. 3,870,953. The actual initiation of the test can be manually as by closure of switch contacts, or cyclically by an intervalometer.

Figure 4:
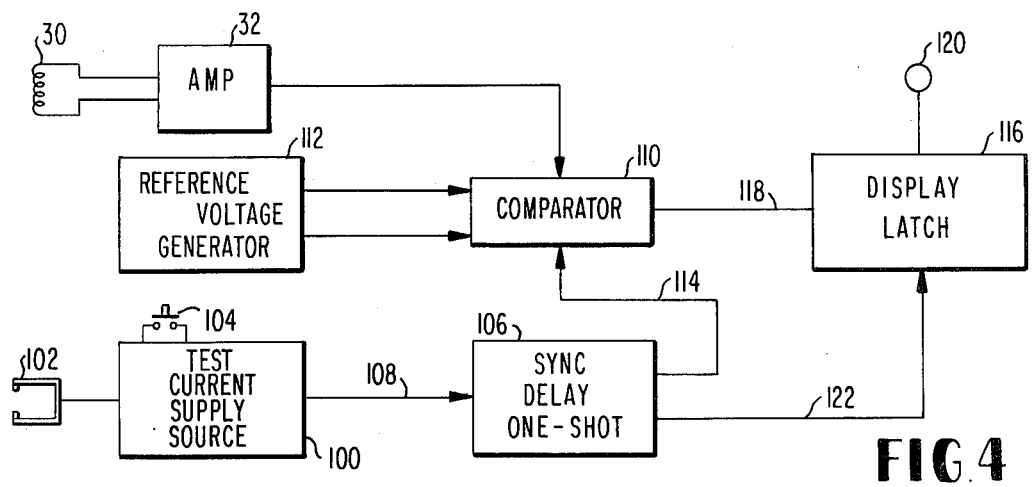
FIG. 4 is a block diagram of yet another embodiment wherein the current sensing device contains its own reference voltage generator.

Referring now to FIG. 4, a further embodiment is illustrated wherein the test current supply source 100 is connected to a contact member 102 which is suitably shaped to engage the contact terminals of the various electronic component packages on a printed circuit board. The current pulses are actuated by a switch contact 104. A sync signal is applied to a sync delay one-shot 106 through lead 108.

The current sensor on probe 30 is connected to amplifier 32 as described in connection with the other figures. The output signal from the amplifier is applied to a comparator 110.

A reference voltage generator 112 is used to provide both a positive reference voltage and a negative reference voltage to comparator circuit 110. The output signal from amplifier 32 may be either negative or positive depending on the orientation of the sensor in probe 30, and the comparator circuit 110 is arranged so that it will respond to voltages of either polarity which are in excess of the positive or negative reference voltage from generator 112. A comparator enable signal is applied to comparator circuit 110 from sync delay one-shot 106 through lead 114. Since the comparator circuit 110 is disabled excepting when the comparator enable signal 114 is present, false responses to spurious signals are generally avoided.

When the voltage output signal from amplifier 32 exceeds the positive or negative voltage from generator 112, a unique signal on lead 118 is applied to the display latch circuit 116 which is a bistable circuit. Fault indicator 120 may be in the form of an LED and illuminated any time the display latch circuit 116 is set. The display latch circuit 116 may be reset by the signal on lead 122 which occurs at the beginning of each test cycle.

Figure 5:
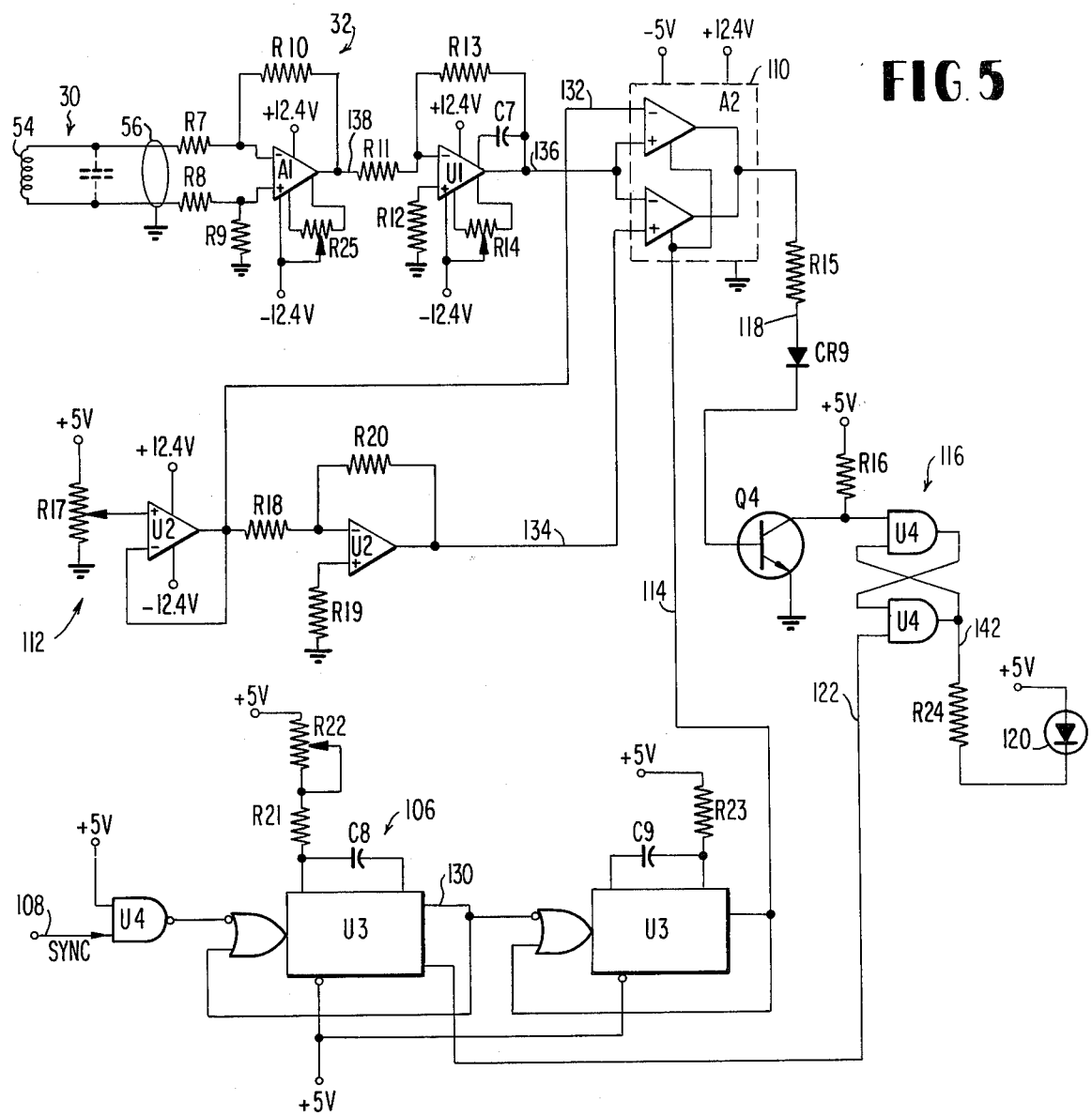
FIG. 5 is a circuit diagram of the current sensing portion of the system shown in FIG. 4.

FIG. 5 is a detailed circuit diagram of the system as shown in FIG. 4 except that the test current supply source 100 and the connector 102 are omitted. The sync signal is applied on lead 108 to the first section of U 3 wich is a dual one-shot multivibrator that is triggered by the leading edge of the sync signal. The positive output of this section is present on lead 130 and may be adjusted to have a duration of approximately 7 $\mu$ seconds by the setting of variable resistor R 22. The trailing edge of the pulse triggers the second one-shot section of U 3 which generates a 0.5 $\mu$ second pulse that is used on lead 114 to enable the comparator circuit 110 which is composed of A 2.

The voltage reference generator 112 consists of both sections of operational amplifier U 2. The positive reference voltage is applied to comparator 110 through lead 132 and the negative voltage is applied through lead 134. In the illustrated embodiment, the reference voltage is set at 0.6 volts DC and the two voltages should be maintained within a few percent of one another.

The amplifier section 32 consists of two operational amps A 1 and U 1. The output of the amplifier on lead 136 is applied to comparator 110. This signal is a slow rising pulse which reaches about one volt in amplitude when the current pulse has an amplitude of between 60 and 100 milliamps. The time required for the voltage on lead 136 to reach the maximum amplitude has been found to be approximately 6 $\mu$ seconds. The output pulse can be negative or positive depending upon the orientation of the inductor 54 of the probe 30.

Amplifier A 1 may be nulled by adjusting R 25 for zero volts output on lead 138. Amplifier U 1 may be nulled by adjusting R 14 for zero volts on its output lead 136. The current sensor probe 30 should be installed at the time the foregoing adjustments are made.

The comparator circuit 110 compares the output signal from the amplifier on lead 136 with the positive and negative reference voltages on lead 132 and 134. When a current pulse having an amplitude greater than the amplitude of the reference voltage is sensed, the output of A 2 on lead 118 will go high, to +5 VDC, for the duration of the comparator input enable circuit signal on lead 114. This causes transistor Q 4 to begin conducting and set the display latch 116 which constitutes a bistable circuit U 4. The output voltage on lead 142 goes low and remains low until latch 116 is reset by the signal on lead 122 which does not occur until the nest test. The fault indicator 120 turns on when the voltage on lead 142 is low and thus provides an indication of the presence of a large current at the probe 30.

The inductor 54 may comprise a small ferrite core as shown in FIG. 2 and have a diameter of approximately ⅛ inch and a length somewhat less than a half inch. The cable 56 may comprise a 2 or 3-foot length of two isulated wires encased in a flexible metal sheath. This construction gives a resonant circuit by reason of the inductor 54 and the distributed capacitance between the two wires in the cable 56 leading to the input of amplifier 32. The resonance of the circuit is influenced by the change in inductance sensed by inductor 54 resulting from the first derivative of the magnetic field associated with the current pulse through the terminal of the component which is sinking the current from the common buss. The circuit senses the current, using the inductance tuned by the capacitance, injected in the buss; amplifies the resultant ringing; and finally checks for coincidence with a delayed sync pulse to unmask the current flowing from the regular Vcc applied in an attempt to pull up the buss to Vcc. When using the circuit of FIG. 5 with the test equipment described in our prior U.S. Pat. No. 3,870,953, a very effective unit is provided.

The identification of the various circuit components shown in FIG. 5 is set forth below:

| COMPONENT | IDENTIFICATION | COMPONENT | IDENTIFICATION |
|---|---|---|---|
| R 7 | 4 K | R 22 | 50 K |
| R 8 | 4 K | R 23 | 15 K |
| R 9 | 100 K | R 24 | 220 OHMS |
| R 10 | 100 K | R 25 | 10 K |
| R 11 | 1 K | C 7 | 100 PF |
| R 12 | 1 K | C 8 | 470 PF |
| R 13 | 100 K | C 9 | 120 PF |
| R 14 | 10 K | A 1 | IC-MA 741 |
| R 15 | 6.8 K | U 1 | IC-NE 531 V |
| R 16 | 1 K | A 2 | IC-MA 711 |
| R 17 | 10 K | U 2 | IC-5558 |
| R 18 | 10 K | U 3 | IC-9602 |
| R 19 | 5.1 K | U 4 | IC-SN 7400 |
| R 20 | 10 K | Q 4 | MPS 3646 |
| R 21 | 5.1 K | Diode CR 9 | IN 4148 |

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and intended to be covered by Letters Patent is:

1. Electrical circuit test apparatus for isolating a wired-OR fault in an electrical circuit supported on a support base and having a plurality of housings mounted on said support base, each of said housings having a plurality of electrical terminals which serve as electrodes for active elements contained in said housings with electrical terminals on one housing being directly connected to electrical terminals on other housings and with some of said terminals being connected to a common buss in a wired-OR configuration; said apparatus being characterized by having:

a power supply for producing a voltage corresponding to a particular logic state and for producing a current pulse at the normal operating voltage level;

means connected to said power supply for controlling all active circuits connected in a wired-OR configuration intended to carry said common buss to a particular logic state and for applying said current pulse to said common buss for a first short time interval;

means for producing a sync signal while supplying said current pulse to said common buss;

current sensing means including a probe sufficiently small to selectively respond to current flow in individual electrical terminals on said housings when placed adjacent an individual electrical terminal;

amplifier means connected to said current sensing means;

circuit means to receive the output signal from said amplifier means and to receive the sync signal to be rendered operative for a second time interval less than said first time interval for detecting a current sensed by said current sensing means above a predetermined level; and means connected to the output of said last mentioned circuit means for producing a unique indication in the event said current level is above said predetermined value, said indication lasting much longer than said first time interval.

2. Apparatus as defined in claim 1 wherein the probe includes a cylindrical ferrite core with a surrounding coil having terminals at opposite ends with the coil terminals being connected to wires in a flexible shielded cable, said cable being connected to a housing including said amplifier means and being part of a tuned input circuit for said amplifier means, said input circuit having a resonant frequency which is affected by the change in inductance of said ferrite core due to the first derivative of the magnetic field surrounding the housing terminal of a circuit component that is sinking current from the common buss.

3. Electrical circuit test apparatus for isolating a wired-OR fault in an electrical circuit employing MOS logic supported on a support base and having a plurality of housings mounted on said support base, each of said housings having dual in-line rows of electrical terminals which serve as electrodes for active elements contained in said housings with electrical terminals on one housing being directly connected to electrical terminals on other housings and with some of said terminals being connected to a common buss in a wired-OR configuration; said apparatus being characterized by having:

a power supply for producing a voltage corresponding to a particular logic state and for producing a current pulse at the normal operating voltage level;

means connected to said power supply for controlling all active circuits connected in a wired-OR configuration intended to carry said common buss to a particular logic state including one terminal which applies said current pulse to said common buss for a first short time interval less than about 10 $\mu$ seconds;

means for producing a sync signal while supplying said current pulse to said buss;

current sensing means including a probe sufficiently small to selectively respond to current flow in individual electrical terminals on said housings when placed adjacent an individual electrical terminal;

amplifier means connected to said current sensing means;

means for generating a positive and a negative reference voltage;

circuit means including a comparator connected to receive both reference voltages and the output signal from said amplifier means and to be enabled in response to the sync signal to be rendered operative for a second time interval less than about 1 $\mu$ second for providing a unique voltage level if the current sensed by said current sensing means exceeds either reference voltage during said second time interval;

indicator means including a bistable circuit connected to the output of said last mentioned circuit means and set to produce a fault indication in response to said unique voltage level; and means for resetting said bistable circuit in response to the sync signal accompanying the beginning of the next short time interval.

4. Apparatus as defined in claim 3 wherein the probe includes a cylindrical ferrite core having terminals at opposite ends with the core terminals being connected to wires in a flexible shielded cable, said cable being connected to a housing including said amplifier means and being part of a tuned input circuit for said amplifier means, said input circuit having a resonant frequency which is affected by the change in inductance of said ferrite core due to the first derivative of the magnetic field surrounding the housing terminal of a circuit component that is sinking current from the common buss.

5. A system for isolating a low impedance fault which causes sinking of electric current through a current carrying element on a printed circuit board comprising:
- a hand manipulatable probe carrying an inductor element at a location on the probe so as to permit the positioning of the inductor element adjacent the current carrying element on the printed circuit board, the inductor element producing an electrical signal as a function of the first derivative of the magnetic field associated with varying current flow in the current carrying element on the printed circuit board;
- means for generating a time synchronization signal in approximate time coincidence with expected variations in current flow in the current carrying element on the printed circuit board;
- means for manually selecting an amplitude reference value; and
- circuit means connected to receive said electrical signal produced by said inductor element and to indicate the presence of excursions of said electrical signal only in excess of said selected amplitude reference value and in time coincidence with said synchronization signal whereby false indications in response to spurious signals are generally avoided.

6. The system of claim 5 wherein said circuit means includes means for generating a synchronization pulse having a predetermined duration and related in time of occurrence to an induced change in current flow in the current carrying element on the printed circuit board, and means for enabling said circuit means to indicate the presence of excursions of said electrical signal only during the duration of said synchronization pulse.

7. The system of claim 5 wherein said circuit means includes means for detecting excursions of said electrical signal in excess of a manually selectable reference value and amplifying means for amplifying said electrical signal and wherein said detecting means comprises comparator circuit means for comparing the amplified electrical signal from said amplifying means to positive and negative reference values so as to detect either positive or negative excusions of said electrical signal in excess of said reference values.

8. The system of claim 5 wherein said circuit means contains capacitance and wherein said inductor connected to said circuit means comprises a resonant circuit that produces a ringing of said electrical signal in response to said changing magnetic field.

9. The system of claim 8 wherein said circuit means includes amplifying means for amplifying said electrical signal, and means for detecting positive or negative excursions in excess of an amplitude selected by manipulation of a manually settable reference circuit.

10. A system for isolating a low impedance fault which causes sinking of electric current through a current carrying element on a printed circuit board comprising:
- means for supplying a test signal causing time varying current to flow in said current carrying element;
- an inductor element on a manually manipulatable probe, the inductor element including a coil wound on a cylindrical ferrite core having a straight longitudinal axis and positionable adjacent to the current carrying element on the printed circuit board to produce an electrical signal in response to changes in magnetic field associated with varying current flow in the current carrying element;
- circuit means connected to said inductor element for amplifying said electrical signal and indicating the presence of positive or negative excursions of said electrical signal in excess of a selectable amplitude said circuit means comprising a signal amplifier connected to receive the electrical signal from the inductor element and an amplitude discriminator manually settable to a selected value and connected to said amplifier to actuate said indicating means only when the electrical signal produced by the inductor element exceeds said selected value, said circuit means further including means synchronized to said test signal for rejecting signals that are not in approximate time synchronization with the time variations of current flow caused by said test signal.

11. The system of claim 10 wherein said signal rejecting means comprises means for generating a synchronization pulse having a predetermined duration and related in time of occurrence to changes in current flow in the current carrying element caused by said test signal, and means for enabling said circuit means to indicate the presence of said excursions only during the duration of said synchronization pulse.

12. The system of claim 10 wherein said circuit means contains capacitance and wherein said inductor connected to said circuit means comprises a resonant circuit that produces a ringing of said electrical signal in response to said changing magnetic field.

13. The system of claim 12 wherein said amplitude discriminator includes means for detecting positive or negative excursions in excess of said amplitude value selected by manipulation of a manually settable reference circuit.

14. The system of claim 10 wherein said inductor element is connected to said circuit means by a cable having a pair of insulated wires in a flexible sheath and having a length of between about two and three feet, the cable having a distributed capacitance that forms a resonant circuit when connected to said inductor element.

15. The system of claim 11 wherein said test signal is supplied by a test signal supply source having a connector for contacting the current carrying element on the printed circuit board, and wherein said synchronization pulse has a duration of less than the duration of the test signal and occurs a predetermined time interval after the occurrence of the test signal.

16. Apparatus as defined in claim 10 wherein the ferrite core and coil have a length of less than about ½ inch as measured in the direction of said longitudinal axis.

17. A method of identifying in a circuit the location of a low impedance fault which causes sinking of current from a buss by:
   providing a circuit containing a plurality of logic circuit components in separate housings each having a plurality of terminals connected to said circuit with at least two of said terminals being connected to said buss in a wire-OR configuration;
   providing apparatus for tracing the current path along said buss including a manually manipulatable probe having an inductor element containing a coil of electrically conductive material having a straight longitudinal axis with a pair of terminals connected to the input of an amplifier circuit including a selectable amplitude value setting means and a synchronization signal providing means that together provide signal amplitude and time discrimination, said coil being adapted to be oriented with its axis perpendicular to the direction of current flow and positioned sufficiently close to the current path so that a current is induced in said coil in response to the first derivative of the magnetic field accompanying a test current pulse in said buss or housing terminal, and an indicator circuit connected to receive the output signal of said amplifier circuit and responsive to the change in inductance of said inductor element when a test current pulse passes through said buss or housing terminal;
   applying to said buss successive, short pulses of test current at a voltage not appreciably higher than the voltage present on said buss during normal operation of a circuit including said buss; and
   identifying the location of the low impedance fault by sequentially positioning the inductor element at different locations along the path of current flow through said buss and housing terminals thereby to produce an input signal for said amplifier circuit, and actuating the indicator circuit in response to test current pulses resulting in a signal from said amplifier circuit above said selectable amplitude value and in time coincidence with said synchronization signal to ascertain where sinking of the current occurs while monitoring said indicator circuit, the low impedance fault being at the location of the probe along said path of current flow where the indication on said indicator is lost.

18. The method of claim 17 wherein the inductor element includes a cylindrical ferrite core which is coaxial with said coil and which during the occurrence of test current pulse is positioned adjacent the path of the test current path with its major axis oriented to be perpendicular to the direction of current flow at the location under test.

19. The method of claim 18 wherein the inductor element is connected in a resonant circuit and the first derivative of the magnetic field accompanying the test current pulse is sufficiently large to cause a ringing effect which is amplified by said amplifier circuit and the output signal of the amplifier circuit is applied to the indicator.

20. The method of claim 19 further including the steps of rectifying and amplifying the ringing effect signal from said resonant circuit to produce an amplifier output signal; comparing the amplifier output signal with a reference signal level; and producing said fault indication in response to a condition when the amplifier output signal level exceeds the reference signal level.

21. The method of claim 20 further including the steps of:
   producing a sync signal related to the occurrence of the current pulse and producing a gating signal in response to said sync signal; and wherein the amplifier output signal level and the reference voltage signal level are compared only during the duration of said gating signal.

22. The method of claim 21 wherein the duration of the gating signal is less than about 1 $\mu$ second and the gating signal is delayed about 6 $\mu$ seconds after the current pulse is applied to said buss.

23. A method of isolating a low impedance fault which causes sinking of electric current through a current carrying element on a printed circuit board comprising the steps of:
   positioning an elongated inductor element disposed at the tip of a hand manipulatable probe adjacent the current carrying element on the printed circuit board in perpendicular relation to the current flow in the current carrying element to produce an electrical signal as a function of the first derivative of the magnetic field due to a varying current in the current carrying element;
   manually selecting an amplitude reference level;
   producing a synchronization signal coinciding in time with expected variations in current in the current carrying element;
   indicating the presence of excursions of said electrical signal produced by said inductor element in excess of said selected amplitude value and in time coincidence with said synchronization signal; and
   physically moving the probe along the current carrying element while continuing to indicate the presence of said excursions above said amplitude to ascertain the location of the low impedance fault.

* * * * *